(12) United States Patent
Zhang et al.

(10) Patent No.: US 9,685,134 B2
(45) Date of Patent: Jun. 20, 2017

(54) SHIFT REGISTER UNIT, GATE DRIVING CIRCUIT AND DISPLAY DEVICE

(71) Applicant: Boe Technology Group Co., Ltd., Beijing (CN)

(72) Inventors: Yuanbo Zhang, Beijing (CN); Seungwoo Han, Beijing (CN); Yunsik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/777,587

(22) PCT Filed: Mar. 19, 2015

(86) PCT No.: PCT/CN2015/074562
§ 371 (c)(1),
(2) Date: Sep. 16, 2015

(87) PCT Pub. No.: WO2016/070543
PCT Pub. Date: May 12, 2016

(65) Prior Publication Data
US 2016/0300542 A1    Oct. 13, 2016

(30) Foreign Application Priority Data

Nov. 7, 2014 (CN) .......................... 2014 1 0643510

(51) Int. Cl.
*G09G 3/36* (2006.01)
*G06F 3/038* (2013.01)
(Continued)

(52) U.S. Cl.
CPC ......... *G09G 3/3677* (2013.01); *G09G 3/3696* (2013.01); *G11C 19/28* (2013.01);
(Continued)

(58) Field of Classification Search
CPC .......... G06F 1/1632; G09G 2310/0286; G09G 3/3677
See application file for complete search history.

(56) References Cited

U.S. PATENT DOCUMENTS

2010/0164854 A1* 7/2010 Kim ..................... G09G 3/3677
345/100
2011/0142191 A1 6/2011 Tobita et al.
(Continued)

FOREIGN PATENT DOCUMENTS

CN     102629444     8/2012
CN     102831860    12/2012
(Continued)

OTHER PUBLICATIONS

Office action from Chinese Application No. 201410643510.0 dated Mar. 20, 2016.
(Continued)

*Primary Examiner* — Alexander Eisen
*Assistant Examiner* — Nan-Ying Yang
(74) *Attorney, Agent, or Firm* — Calfee, Halter & Griswold LLP

(57) ABSTRACT

The present invention provides a shift register unit, a gate driving circuit and a display device, which belongs to the field of display technology. The shift register unit of the present invention comprises: an input module, a pull-up module, a pull-down control module, a pull-down module, a reset module and a discharge module.

16 Claims, 4 Drawing Sheets

(51) Int. Cl.
*G09G 5/00* (2006.01)
*G11C 19/28* (2006.01)
(52) U.S. Cl.
CPC ........... *G09G 2300/0809* (2013.01); *G09G 2300/0842* (2013.01); *G09G 2310/0286* (2013.01)

(56) References Cited

U.S. PATENT DOCUMENTS

2012/0249502 A1* 10/2012 Takahashi ............ G09G 3/3677
345/205
2013/0028370 A1* 1/2013 Kikuchi ............... G09G 3/3677
377/64

FOREIGN PATENT DOCUMENTS

| | | |
|---|---|---|
| CN | 102855938 | 1/2013 |
| CN | 103093825 | 5/2013 |
| CN | 103680452 | 3/2014 |
| CN | 103700356 | 4/2014 |
| CN | 104299594 | 1/2015 |
| CN | 204102544 | 1/2015 |
| JP | 2011060411 | 3/2011 |
| WO | 2014/172960 | 10/2014 |

OTHER PUBLICATIONS

International Search Report and Written Opinion from PCT/CN15/074562 dated Jul. 17, 2015.
Office action from Chinese Application No. 201410643510.0 dated Jul. 1, 2016.

* cited by examiner

US 9,685,134 B2

1

SHIFT REGISTER UNIT, GATE DRIVING CIRCUIT AND DISPLAY DEVICE

RELATED APPLICATIONS

The present application is the U.S. national phase entry of PCT/CN2015/074562, with an international filing date of Mar. 19, 2015, which claims the benefit of Chinese Patent Application No. 201410643510.0 filed Nov. 7, 2014, the entire disclosures of which are incorporated herein by reference.

FIELD OF THE INVENTION

The present invention belongs to the field of display technology, particularly to a shift register unit, a gate driving circuit and a display device.

BACKGROUND OF THE INVENTION

The basic principle for a TFT-LCD (Thin Film Transistor-Liquid Crystal Display) to display a frame of an image is inputting a square wave of a certain width to each row of pixels successively from top to bottom through a gate driving circuit for gating, then outputting the signal required by the row of pixels successively through a source driving circuit. At present, in a display device of such a structure, the gate driving circuit and the source driving circuit are generally connected on the glass panel through COF (Chip On Film) or COG (Chip On Glass) process. However, when the resolution is relatively high, there are more outputs at both the gate driving circuit and the source driving circuit, and the length of the driving circuit will also be increased. This is not benefit for the bonding process of the module driving circuit.

In order to overcome the above problem, the existing display device may adopt a GOA (Gate Drive On Array) circuit. Compared with the existing COF or COG processes, the GOA circuit not only saves the cost but also can achieve symmetrical design of both sides of the panel. Additionally, it can also save the bonding area of the gate driving circuit and the peripheral wiring space, thereby realizing narrow frame design of the display device, and improving capacity and yield of the display device. However, the existing GOA circuit also has certain problems. As shown in FIG. 1, there is a relatively large number of the thin film transistors (TFTs) in the existing GOA, so it occupies a relatively large space. In addition, since the existing circuit can only discharge the signal output end OUTPUT through the transistor M, the transistor M has a very large size, and occupies a relatively large space. Moreover, the control terminal voltage of the transistor M is the output of a certain stage of shift register unit below this shift register unit. Hence, the control terminal voltage value of the transistor M is a high level of the output voltage. However, since the high level is not high enough, the size of the transistor M has to be relatively large, it can be ensured that the output delay is within the range of the normal work, thereby also rendering the space occupied by the GOA circuit to be relatively large.

SUMMARY OF THE INVENTION

The technical problem to be solved by the present invention includes, with respect to the above problem in the existing shift register unit, providing a shift register unit with a simple structure, a gate driving circuit and a display device.

The technical solution adopted for solving the technical problem of the present invention is a shift register unit, comprising: an input module, a pull-up module, a pull-down control module, a pull-down module, and a reset module and a discharge module. The input module is connected to a signal input end and a pull-up control node, for controlling electric potential of the pull-up control node based on a signal inputted by the signal input end, the pull-up control node being a connection point of the input module and the pull-up module. The pull-up module is connected to the pull-up control node, a first clock signal port and a signal output end, for pulling up a signal outputted by the signal output end to be of high level based on the control of the electric potential of the pull-up control node and a clock signal inputted by the first clock signal port. The pull-down control module is connected to a pull-down control node and a second clock signal port, for controlling a level of the pull-down control node based on a level of the second clock signal port, the pull-down control node being a connection point of the pull-down control module and the pull-down module. The pull-down module is connected to the pull-down control node, the pull-up control node, the second clock signal port and a low level signal, for pulling down the pull-down control node to be a low level through the low level signal based on the electric potential of the pull-up control node. The discharge module comprises a discharge capacitor, a first end of the discharge capacitor being connected to the pull-up module and the pull-up control node, a second end being connected to an output signal reset input end, for maintaining the electric potential of the pull-up control node under the control of a signal inputted by the output signal reset input end, the signal output end being discharged through the pull-up module. The reset module is connected to a reset signal input end, the pull-up control node and the low level signal (for pulling down the level of the pull-up control node through a signal inputted by the reset signal input end).

In the present invention, because the discharge module of the shift register unit adopts a discharge capacitor, the number of its transistors is less than that in the prior art. Therefore, its structure is simple, the power consumption is small, and the delay problem is mitigated.

In some embodiments, the input module comprises a first transistor, wherein a first terminal of the first transistor is connected to its control terminal and the signal input end, a second terminal is connected to the pull-up control node. The pull-up module may comprise a second transistor and a storage capacitor, wherein a first terminal of the second transistor is connected to the first clock signal port, a second terminal is connected to a second end of the storage capacitor and the signal output end, and a control terminal is connected to the pull-up control node. A first end of the storage capacitor is connected to the pull-up control node and the first end of the discharge capacitor. The pull-down control module may additionally comprise a third transistor and a fourth transistor, wherein a first terminal of the third transistor is connected to its control terminal and a second terminal of the fourth transistor, a second terminal is connected to a control terminal of the fourth transistor and the pull-down module, a control terminal is connected to the second clock signal port; and a first terminal of the fourth transistor is connected to the pull-down control node.

Further, in some embodiments, the pull-down module comprises a fifth transistor and a sixth transistor, wherein a first terminal of the fifth transistor is connected to the second terminal of the third transistor and the control terminal of the fourth transistor, a second terminal is connected to the low level signal, a control terminal is connected to a control terminal of the sixth transistor; and a first terminal of the sixth transistor is connected to the pull-down control node, a second terminal is connected to a low level signal, the control terminal is connected to the pull-up control node.

Further, in some embodiments, the discharge module further comprises a discharge device, the discharge device being connected to the signal output end, the low level signal and the discharge capacitor, for discharging the signal output end based on the electric potential of the discharge capacitor.

In some embodiments, the discharge device comprises a seventh transistor, wherein a first terminal of the seventh transistor is connected to the second terminal of the second transistor, the second end of the storage capacitor and the signal output end, a second terminal is connected to the low level signal, a control terminal is connected to the second end of the discharge capacitor.

Further, in some embodiments, the reset module comprises an eighth transistor, wherein a first terminal of the eighth transistor is connected to the pull-up control node, a second terminal is connected to the low level signal, a control terminal is connected to the reset signal input end.

In some embodiments, the shift register unit further comprises a noise reduction module, the noise reduction module being connected to the low level signal, the pull-up control node and the pull-down control node, for pulling down the electric potential of the pull-up control node through the low level signal based on the electric potential of the pull-down control node, so as to remove noise of the shift register unit. In some of those embodiments, the noise reduction module comprises a ninth transistor and a tenth transistor, wherein a first terminal of the ninth transistor is connected to the pull-up control node, a second terminal is connected to the low level signal, a control terminal is connected to the pull-down control node; a first terminal of the tenth transistor is connected to the signal output end, a second terminal is connected to the low level signal, a control terminal is connected to the pull-down control node.

The technical solution adopted for solving the technical problem of the present invention is a gate driving circuit comprising at least four cascaded shift register units as stated in any of the above, wherein, except for the first stage and the second stage of shift register units from the last, the signal output end of each of the other shift register units is connected to the signal input end of its next second stage of shift register unit; except for the first stage and the second stage of shift register units, the signal output end of each of the other shift register units is connected to the output signal reset input end of its previous second stage of shift register unit; except for the first stage, the second stage and the third stage of shift register units, the signal output end of each of the other shift register units is connected to the reset signal input end of its previous third stage of shift register unit; and the signal input ends of the first stage and the second stage of shift register units are connected to a frame strobe signal.

The technical solution adopted for solving the technical problem of the present invention is a display device comprising a gate driving circuit stated above.

DETAILED DESCRIPTION OF THE INVENTION

In order to enable the skilled person in the art to understand the technical solution of the present invention better, the present invention will be described herein in more details with reference to the drawings and the specific embodiments.

The transistors used in the embodiments of the present invention may be thin film transistors or field effect transistors or other similar devices. Since the source and the drain of the transistor used are symmetrical, there is no difference between the source and the drain. In the embodiments of the present invention, in order to differentiate the source and the drain of the transistor, one terminal thereof is called a first terminal, the other terminal is called a second terminal, and the gate is called a control terminal. In addition, the transistors can be classified into N-type transistors and P-type transistors. The N-type transistors are taken as the example for explanation in the embodiments of the present invention, when the N-type transistors are used, the first terminal is the source of the N-type transistor, the second terminal is the drain of the N-type transistor. A skilled person in the art will appreciate using P-type transistors to carry out the present invention without undue experimentation, and is therefore within the protection scope of the embodiments of the present invention.

Figure 1:
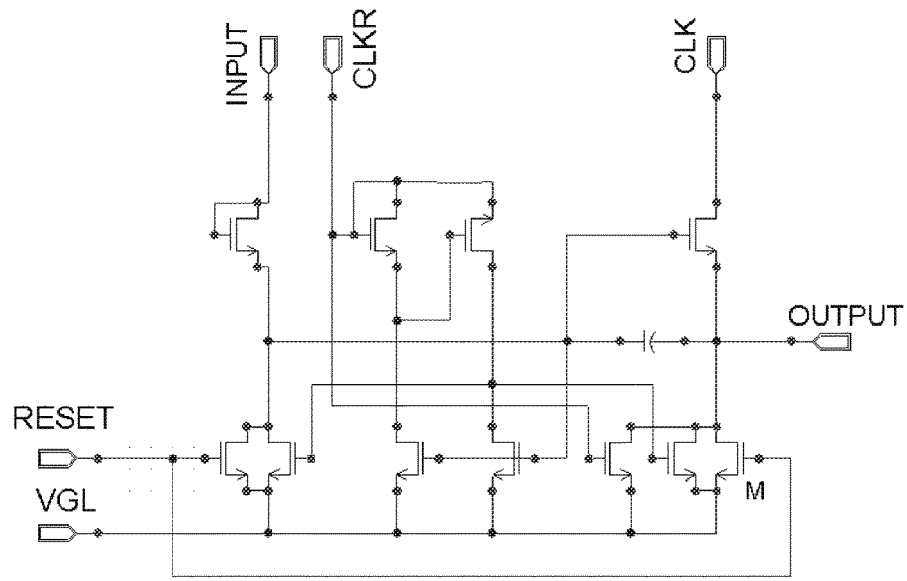
FIG. 1 is a schematic view of an existing shift register unit.
Figure 2:
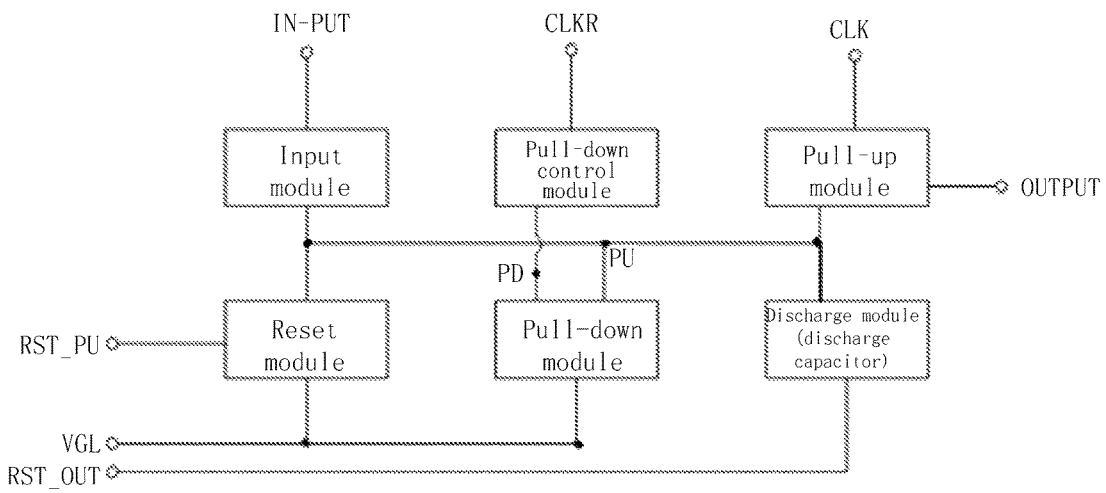
FIG. 2 is a schematic view of a shift register unit according to an embodiment of the present invention.

As shown in FIG. 2, this embodiment provides a shift register unit, comprising: an input module, a pull-up module, a pull-down control module, a pull-down module, a reset module and a discharge module. The input module is connected to a signal input end INPUT and a pull-up control node PU, for controlling electric potential of the pull-up control node PU based on a signal inputted by the signal input end INPUT, the pull-up control node PU being a connection point of the input module and the pull-up module. The pull-up module is connected to the pull-up control node PU, a first clock signal port CLK and a signal output end OUTPUT, for pulling up a signal outputted by the signal output end OUTPUT to be of high level based on the control of the electric potential of the pull-up control node PU and a clock signal inputted by the first clock signal port CLK. The pull-down control module is connected to a pull-down control node PD and a second clock signal port CLKR, for controlling a level of the pull-down control node PD based on a level of the second clock signal port CLKR, the pull-down control node PD being a connection point of the pull-down control module and the pull-down module. The pull-down module is connected to the pull-up control node PU, the pull-down control node PD, and a low level signal VGL, for pulling down the pull-down control node PD to be a low level through the low level signal when the pull-down module is turned on. The discharge module comprises a discharge capacitor, a first end of the discharge capacitor being connected to the pull-up module and the pull-up control node PU, a second end being connected to an output signal reset input end RST_OUT, wherein the signal inputted by the output signal reset input end RST_OUT controls the discharge capacitor C2 so as to maintain the electric potential of the pull-up control node PU, the signal output end OUTPUT is discharged through the pull-up module. The reset module is connected to a reset signal input end RST_PU and the pull-up control node PU, for pulling down the level of the pull-up control node PU through a signal inputted by the reset signal input end RST_PU.

In this embodiment, the discharge capacitor C2 serves as the discharge module, compared with the discharge module constituted by transistors in the prior art, the discharge capacitor C2 occupies a relatively small area, thereby being capable of reducing the occupation space of the shift register unit while discharging the shift register unit well.

Figure 4:
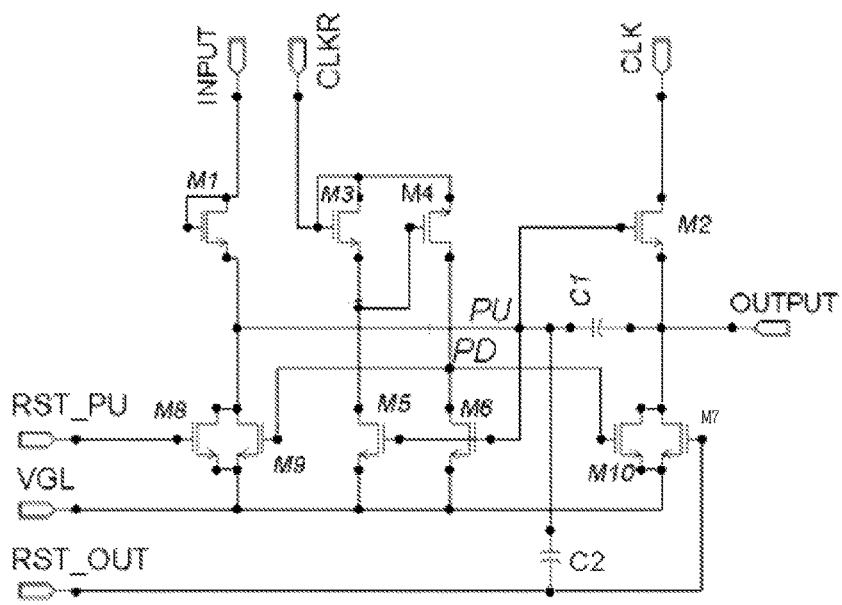
FIG. 4 is a circuit diagram of a shift register unit according to an embodiment of the present invention.

As shown in FIG. 4, in the shift register unit of this embodiment, the input module comprises a first transistor M1. A first terminal of the first transistor M1 is connected to its control terminal and the signal input end INPUT, a second terminal is connected to the pull-up control node PU and the reset module.

In this embodiment, the pull-up control node PU is a node that controls turn-on or turn-off of the pull-up module. The input module is used for determining the state of the pull-up control node PU in the shift register unit based on whether the signal inputted by the signal input end INPUT is of high level or low level.

In some embodiments, the pull-up module comprises a second transistor M2 and a storage capacitor C1. A first terminal of the second transistor M2 is connected to the first clock signal port CLK, a second terminal is connected to a second end of the storage capacitor C1 and the signal output end OUTPUT, and a control terminal is connected to the pull-up control node PU. A first end of the storage capacitor C1 is connected to the pull-up control node PU and the first end of the discharge capacitor C2 in the discharge module.

In some embodiments, the pull-down control module comprises a third transistor M3 and a fourth transistor M4. A first terminal of the third transistor M3 is connected to its control terminal and a second terminal of the fourth transistor M4. A second terminal is connected to a control terminal of the fourth transistor M4 and the pull-down module. A control terminal is connected to the second clock signal port CLKR. A first terminal of the fourth transistor M4 is connected to the pull-down control node PD.

In some embodiments, the pull-down module comprises a fifth transistor M5 and a sixth transistor M6. A first terminal of the fifth transistor M5 is connected to the second terminal of the third transistor M3 and the control terminal of the fourth transistor M4, a second terminal is connected to the low level signal, and a control terminal is connected to a control terminal of the sixth transistor M6. A first terminal of the sixth transistor M6 is connected to the pull-down control node PD, a second terminal is connected to the low level signal, the control terminal is connected to the pull-up control node PU.

In addition to the discharge capacitor C2, the discharge module may further comprise a seventh transistor M7 (i.e., a discharge device). A first terminal of the seventh transistor M7 is connected to the second terminal of the second transistor M2, the second end of the storage capacitor C1 and the signal output end OUTPUT, a second terminal is connected to the low level signal, and a control terminal is connected to the second end of the discharge capacitor C2.

Preferably, the reset module comprises an eighth transistor M8. A first terminal of the eight transistor M8 is connected to the pull-up control node PU, a second terminal is connected to the low level signal VGL, and a control terminal is connected to the reset signal input end RST_PU.

Figure 3:
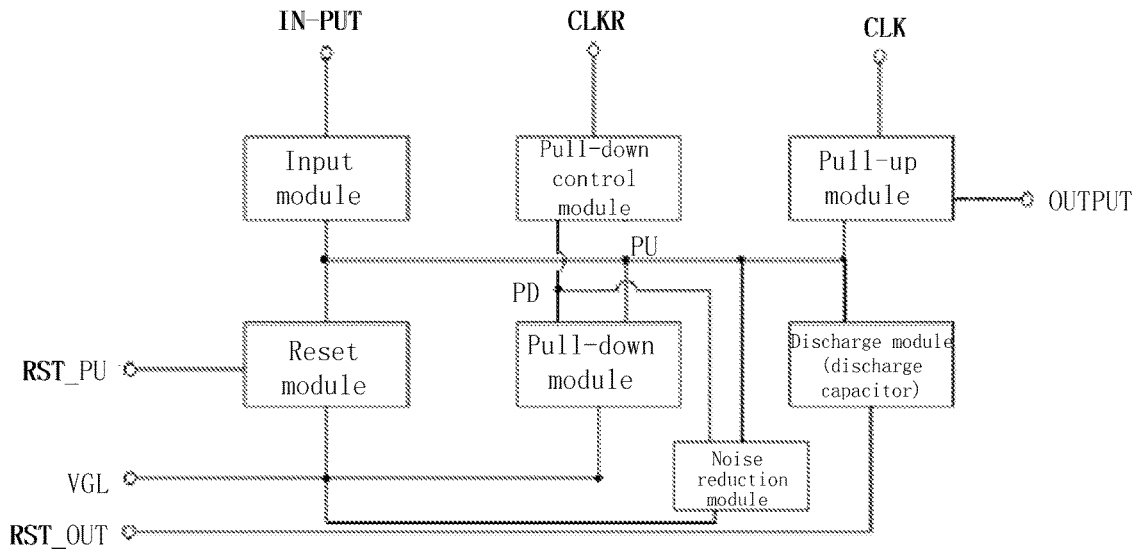
FIG. 3 is a schematic view of a shift register unit according to another embodiment of the present invention.

The register unit may further comprise a noise reduction module, as shown in FIG. 3 and FIG. 4. The noise reduction module is connected to the low level signal VGL, the pull-up control node PU, and the pull-down control node PD, for pulling down the electric potential of the pull-up control node PU through the low level signal VGL based on the electric potential of the pull-down control node PD, so as to remove noise of the shift register unit. In some embodiments, the noise reduction module comprises a ninth transistor M9 and a tenth transistor M10. A first terminal of the ninth transistor M9 is connected to the pull-up control node PU, a second terminal is connected to the low level signal VGL, and a control terminal is connected to the pull-down control node PD. A first terminal of the tenth transistor M10 is connected to the signal output end OUTPUT, a second terminal is connected to the low level signal VGL, and a control terminal is connected to the pull-down control node PD.

In this embodiment, the discharge module comprises a discharge capacitor C2. Due to the capacitance coupling effect of the discharge capacitor C2, the electric potential of the pull-up control node PU can remain unchanged. Hence, the signal output end OUTPUT can be discharged well, thereby being capable of reducing the size of the second transistor M2, also capable of reducing the size of the seventh transistor M7, and even capable of omitting the seventh transistor M7, so as to save space and reduce the power consumption of the shift register unit.

Figure 6:
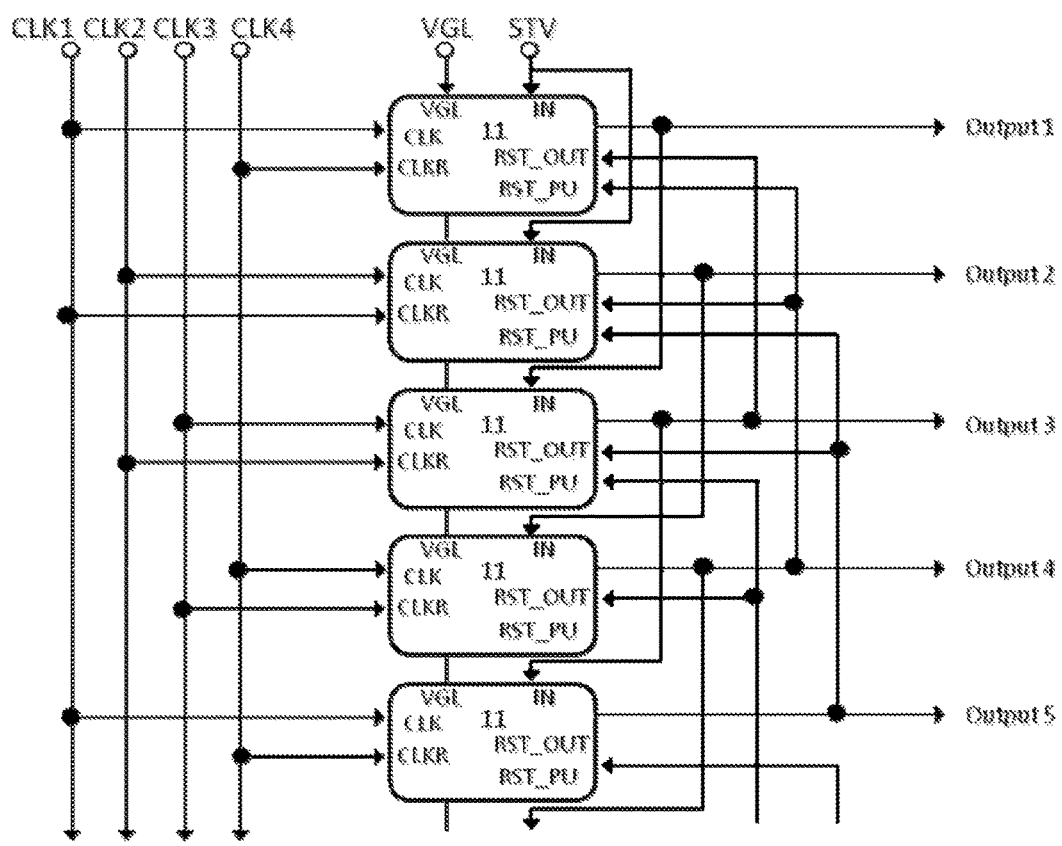
FIG. 6 is a schematic view of a gate driving circuit according to an embodiment of the present invention.

According to another aspect of the present invention, a gate driving circuit is further provided. FIG. 6 shows a schematic view of a gate driving circuit according to an embodiment of the present invention. As shown in FIG. 6, the gate driving circuit comprises at least four cascaded shift register units as stated above. Except for the first stage and the second stage of shift register units from the last, the signal output end OUTPUT of each of the other shift register units is connected to the signal input end INPUT of its next second stage of shift register unit. For example, the signal output end OUTPUT of the first stage of shift register unit is connected to the signal input end INPUT of the third stage of shift register unit. Except for the first stage and the second stage of shift register units, the signal output end OUTPUT of each of the other shift register units is connected to the output signal reset input end RST_OUT of its previous second stage of shift register unit. For example, the signal output end OUTPUT of the third stage of shift register unit is connected to the output signal reset input end RST_OUT of the first stage of shift register unit. Except for the first stage, the second stage, and the third stage of shift register units, the signal output end OUTPUT of each of the other shift register units is connected to the reset signal input end RST_PU of its previous third stage of shift register unit. For example, the signal output end OUTPUT of the fourth stage of shift register unit is connected to the reset signal input end RST_PU of the first stage of shift register unit. The signal input ends INPUT of the first stage and the second stage of shift register units are connected to a frame strobe signal STV.

For the sake of conciseness, FIG. 6 only illustrates five cascaded shift register units. However, a skilled person in the art should appreciate that the number of the shift register units can be selected arbitrarily based on actual needs. The specific connecting manners may refer to the above explanations, which will not be repeated here.

Figure 5:
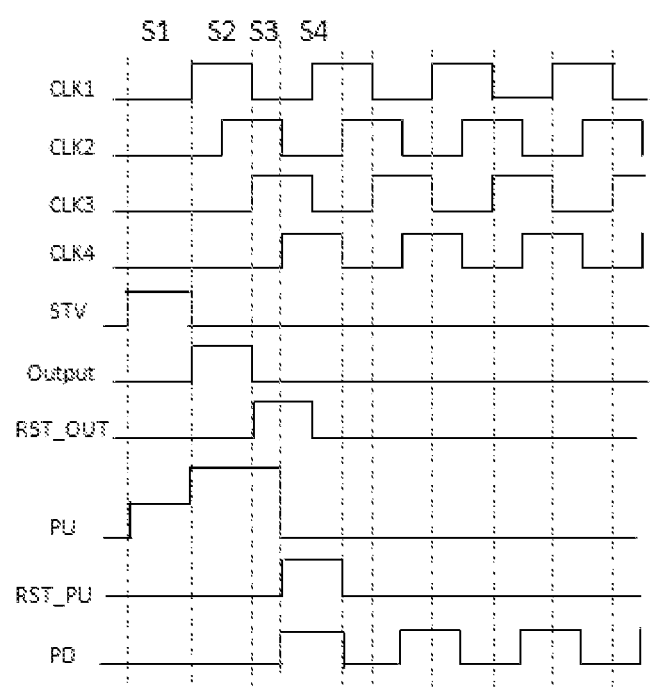
FIG. 5 is a timing diagram of working of a shift register unit according to an embodiment of the present invention.

Next, in order to understand the gate driving circuit of this embodiment, the driving method of the gate driving circuit will be explained with reference to FIG. 4 and FIG. 5.

In the phase of S1, the signal (frame strobe signal STV) inputted by the signal input end INPUT is a high level signal. Here, the first transistor M1 is turned on, and the pull-up control node PU is charged.

In the phase of S2, the first clock signal port CLK (connected to CLK1) inputs a high level signal. Since the pull-up control node PU has been charged in S1, it is of high level. Here, the second transistor M2 is turned on, and the signal output end OUTPUT outputs a high level signal.

In phase S3, the input of the first clock signal port CLK becomes a low level signal from a high level signal. At the same time, the signal inputted by the output signal reset input end RST_OUT is a signal outputted by the signal output end OUTPUT of its next second stage of shift register unit. Since here the signal inputted by the first clock signal port CLK of its next second stage of shift register unit is a high level signal (CLK3), the signal outputted by the signal output end OUTPUT of its next second stage of shift register unit is of high level. In other words, the signal inputted by the output signal reset input end RST_OUT is of high level. Due to the existence of the discharge capacitor C2, in the case that the storage capacitor C1 and the discharge capacitor C2 are similar in size, the electric potential of the pull-up control node PU is substantially unchanged. Hence, the signal output end OUTPUT can be discharged well through the second transistor M2. In addition, when the signal inputted by RST_OUT is of high level, the second transistor M7 is turned on. Since the second terminal of the seventh transistor M7 is connected to the low level signal VGL, here the signal output end OUTPUT can also be discharged through the seventh transistor M7.

In the phase S4, the eighth transistor M8 is turned on since the reset signal input end RST_PU is connected to the signal output end OUTPUT of its next third stage of shift register unit, and here the signal output end OUTPUT of its next third stage of shift register unit outputs a high level signal, so the signal inputted by the reset signal input end RST_PU is of high level. Since the second terminal of the eighth transistor M8 is connected to the low level signal VGL, the electric potential of the pull-up control node PU is pulled down, thereby accomplishing the charging of the gate lines connected to this shift register unit and the resetting of the pull-up control node PU.

In other working processes, in order to avoid existence of noise in the signal outputted by the signal output end OUTPUT, when the pull-down control node PD is pulled up to be of high level by the signal of the second clock signal port CLKR (connected to CLK4), periodically, the ninth transistor M9 and the tenth transistor M10 are turned on. Therefore, the electric potentials of the pull-up control node PU and the signal output end OUTPUT are pulled down, thereby removing the noise and preventing error output.

As stated above, in this embodiment, since the discharge module comprises a discharge capacitor C2, the point voltage of the pull-up control node PU in the phase of S3 remains unchanged. The point voltage value will be double or so of the high level of the output voltage of the signal output end OUTPUT, hence, the control terminal of the second transistor M2 will remain a very high electric potential. The signal output end OUTPUT can be discharged to a low level well through the second transistor M2 (because here the first clock signal port CLK is of a low electric potential). Therefore, the size of the second transistor M2 can be reduced, the size of the seventh transistor M7 can also be reduced greatly, the seventh transistor M7 can be even omitted, so that the power consumption and the occupation area of the shift register unit can be both reduced.

According to a further aspect of the present invention, a display device is further provided. The display device comprises a gate driving circuit as stated above. The display device may be any product or component with the display function such as a mobile phone, a panel computer, a television, a display, a laptop, a digital photo frame, a navigator etc.

Since the display device comprises the gate driving circuit provided by the present invention, it can realize narrow frame design.

Indeed, the display device provided by the present invention may further comprise other conventional structures, such as a display driving unit etc., which will not be elaborated here.

The above embodiments are only exemplary embodiments used for explaining the principle of the present invention, however, the present invention is not limited to this. The ordinary skilled person in the art, without departing from the spirit and essence of the present invention, can make various modifications and improvements without undue experimentation. These modifications and improvements are also regarded as the protection scopes of the present invention.

What is claimed is:

1. A shift register unit, comprising: an input module, a pull-up module, a pull-down control module, a pull-down module, a reset module and a discharge module;

the input module being connected to a signal input end and a pull-up control node, for controlling electric potential of the pull-up control node based on a signal inputted by the signal input end, the pull-up control node being a connection point of the input module and the pull-up module;

the pull-up module being connected to the pull-up control node, a first clock signal port and a signal output end, for pulling up a signal outputted by the signal output end to be of high level based on the control of the electric potential of the pull-up control node and a clock signal inputted by the first clock signal port;

the pull-down control module being connected to a pull-down control node and a second clock signal port, for controlling a level of the pull-down control node based on a level of the second clock signal port, the pull-down control node being a connection point of the pull-down control module and the pull-down module;

the pull-down module being connected to the pull-down control node, the pull-up control node and a low level signal, for pulling down the pull-down control node to be a low level through the low level signal based on the electric potential of the pull-up control node;

the discharge module comprising a discharge capacitor, a first end of the discharge capacitor being connected to the pull-up module and the pull-up control node, a second end being connected to an output signal reset input end, for maintaining the electric potential of the pull-up control node under the control of a signal inputted by the output signal reset input end, the signal output end being discharged through the pull-up module;

the reset module being connected to a reset signal input end, the pull-up control node and the low level signal, for pulling down the level of the pull-up control node through a signal inputted by the reset signal input end, wherein the discharge module further comprises a discharge device, the discharge device being connected to the signal output end, the low level signal and the discharge capacitor, for discharging the signal output end based on the electric potential of the discharge capacitor, and the discharge device comprises a seventh transistor, a first terminal of the seventh transistor is connected to the second terminal of the second transistor, the second end of the storage capacitor and the signal output end, a second terminal is connected to the low level signal, a control terminal is connected to the second end of the discharge capacitor.

2. The shift register unit according to claim 1, wherein the input module comprises a first transistor, a first terminal of the first transistor is connected to its control terminal and the signal input end, a second terminal is connected to the pull-up control node.

3. The shift register unit according to claim 2, wherein the pull-up module comprises a second transistor and a storage capacitor,
a first terminal of the second transistor is connected to the first clock signal port, a second terminal is connected to a second end of the storage capacitor and the signal output end, a control terminal is connected to the pull-up control node;
a first end of the storage capacitor is connected to the pull-up control node and the first end of the discharge capacitor.

4. The shift register unit according to claim 3, wherein the pull-down control module comprises a third transistor and a fourth transistor,
a first terminal of the third transistor is connected to its control terminal and a second terminal of the fourth transistor, a second terminal is connected to a control terminal of the fourth transistor and the pull-down module, a control terminal is connected to the second clock signal port;
a first terminal of the fourth transistor is connected to the pull-down control node.

5. The shift register unit according to claim 4, wherein the pull-down module comprises a fifth transistor and a sixth transistor,
a first terminal of the fifth transistor is connected to the second terminal of the third transistor and the control terminal of the fourth transistor, a second terminal is connected to the low level signal, a control terminal is connected to a control terminal of the sixth transistor;
a first terminal of the sixth transistor is connected to the pull-down control node, a second terminal is connected to a low level signal, the control terminal is connected to the pull-up control node.

6. The shift register unit according to claim 1, wherein the reset module comprises an eighth transistor,
a first terminal of the eighth transistor is connected to the pull-up control node, a second terminal is connected to the low level signal, a control terminal is connected to the reset signal input end.

7. A shift register unit, comprising: an input module, a pull-up module, a pull-down control module, a pull-down module, a reset module and a discharge module;
the input module being connected to a signal input end and a pull-up control node, for controlling electric potential of the pull-up control node based on a signal inputted by the signal input end, the pull-up control node being a connection point of the input module and the pull-up module;
the pull-up module being connected to the pull-up control node, a first clock signal port and a signal output end, for pulling up a signal outputted by the signal output end to be of high level based on the control of the electric potential of the pull-up control node and a clock signal inputted by the first clock signal port;
the pull-down control module being connected to a pull-down control node and a second clock signal port, for controlling a level of the pull-down control node based on a level of the second clock signal port, the pull-down control node being a connection point of the pull-down control module and the pull-down module;
the pull-down module being connected to the pull-down control node, the pull-up control node and a low level signal, for pulling down the pull-down control node to be a low level through the low level signal based on the electric potential of the pull-up control node;
the discharge module comprising a discharge capacitor, a first end of the discharge capacitor being connected to the pull-up module and the pull-up control node, a second end being connected to an output signal reset input end, for maintaining the electric potential of the pull-up control node under the control of a signal inputted by the output signal reset input end, the signal output end being discharged through the pull-up module;
the reset module being connected to a reset signal input end, the pull-up control node and the low level signal, for pulling down the level of the pull-up control node through a signal inputted by the reset signal input end,
wherein the shift register unit further comprises a noise reduction module, the noise reduction module being connected to the low level signal, the pull-up control node and the pull-down control node, for pulling down the electric potential of the pull-up control node through the low level signal based on the electric potential of the pull-down control node, so as to remove noise of the shift register unit, and the noise reduction module comprises a ninth transistor and a tenth transistor,
a first terminal of the ninth transistor is connected to the pull-up control node, a second terminal is connected to the low level signal, a control terminal is connected to the pull-down control node;
a first terminal of the tenth transistor is connected to the signal output end, a second terminal is connected to the low level signal, a control terminal is connected to the pull-down control node.

8. A gate driving circuit, comprising at least four cascaded shift register units according to claim 1, wherein
the signal output end of each of the other shift register units, except for the last stage and the next to the last stage of shift register units, is connected to the signal input end of the shift register unit two stages subsequent to each corresponding shift register unit;
the signal output end of each of the shift register units, except for the first stage and the second stage of shift register units, is connected to the output signal reset input end of the shift register unit two stages previous to each corresponding shift register unit;
the signal output end of each of the other shift register units, except for the first stage, the second stage and the third stage of shift register units, is connected to the reset signal input end of the shift register unit three stages previous to each corresponding shift register unit; and
the signal input ends of the first stage and the second stage of shift register units are connected to a frame strobe signal.

9. The gate driving circuit according to claim 8, wherein the input module comprises a first transistor, a first terminal of the first transistor is connected to its control terminal and the signal input end, a second terminal is connected to the pull-up control node.

10. The gate driving circuit according to claim 9, wherein the pull-up module comprises a second transistor and a storage capacitor,
   a first terminal of the second transistor is connected to the first clock signal port, a second terminal is connected to a second end of the storage capacitor and the signal output end, a control terminal is connected to the pull-up control node;
   a first end of the storage capacitor is connected to the pull-up control node and the first end of the discharge capacitor.

11. The gate driving circuit according to claim 10, wherein the pull-down control module comprises a third transistor and a fourth transistor,
   a first terminal of the third transistor is connected to its control terminal and a second terminal of the fourth transistor, a second terminal is connected to a control terminal of the fourth transistor and the pull-down module, a control terminal is connected to the second clock signal port;
   a first terminal of the fourth transistor is connected to the pull-down control node.

12. The gate driving circuit according to claim 11, wherein the pull-down module comprises a fifth transistor and a sixth transistor,
   a first terminal of the fifth transistor is connected to the second terminal of the third transistor and the control terminal of the fourth transistor, a second terminal is connected to the low level signal, a control terminal is connected to a control terminal of the sixth transistor;
   a first terminal of the sixth transistor is connected to the pull-down control node, a second terminal is connected to a low level signal, the control terminal is connected to the pull-up control node.

13. The gate driving circuit according to claim 8, wherein the reset module comprises an eighth transistor,
   a first terminal of the eighth transistor is connected to the pull-up control node, a second terminal is connected to the low level signal, a control terminal is connected to the reset signal input end.

14. A display device comprising a gate driving circuit according to claim 8.

15. A gate driving circuit, comprising at least four cascaded shift register units according to claim 7, wherein
   the signal output end of each of the other shift register units, except for the last stage and the next to the last stage of shift register units, is connected to the signal input end of the shift register unit two stages subsequent to each corresponding shift register unit;
   the signal output end of each of the shift register units, except for the first stage and the second stage of shift register units, is connected to the output signal reset input end of the shift register unit two stages previous to each corresponding shift register unit;
   the signal output end of each of the other shift register units, except for the first stage, the second stage and the third stage of shift register units, is connected to the reset signal input end of the shift register unit three stages previous to each corresponding shift register unit; and
   the signal input ends of the first stage and the second stage of shift register units are connected to a frame strobe signal.

16. A display device comprising a gate driving circuit according to claim 15.

* * * * *